(12) United States Patent
Fujieda et al.

(10) Patent No.: US 6,919,387 B2
(45) Date of Patent: Jul. 19, 2005

(54) ELECTROMAGNETIC WAVE ABSORBER, METHOD OF MANUFACTURING THE SAME AND APPLIANCE USING THE SAME

(75) Inventors: Tadashi Fujieda, Mito (JP); Shinzou Ikeda, Tokai (JP); Sai Ogawa, Tokai (JP); Teruyoshi Abe, Hitachi (JP); Yasuhisa Aono, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 419 days.

(21) Appl. No.: 09/828,150

(22) Filed: Apr. 9, 2001

(65) Prior Publication Data

US 2003/0190498 A1 Oct. 9, 2003

(30) Foreign Application Priority Data

Apr. 10, 2000 (JP) ........................................ 2000-107519

(51) Int. Cl.[7] ................................................ G21K 1/10

(52) U.S. Cl. ........................... 523/137; 340/928; 342/1; 428/402; 428/404

(58) Field of Search ................................. 428/402, 404, 428/928; 523/137; 252/521.2, 62.54; 264/37.1, 102; 524/495; 342/1, 4; 398/39; 340/928; 427/458

(56) References Cited

U.S. PATENT DOCUMENTS

| | | | | |
|---|---|---|---|---|
| 3,591,362 A | * | 7/1971 | Benjamin | 428/570 |
| 4,948,676 A | * | 8/1990 | Darracq et al. | 428/539.5 |
| 5,118,587 A | * | 6/1992 | Takaragi et al. | 430/106.2 |
| 5,543,187 A | * | 8/1996 | Errico et al. | 428/34.6 |
| 5,731,085 A | * | 3/1998 | Hakata et al. | 428/402 |
| 5,940,022 A | * | 8/1999 | Takatsu | 341/1 |
| 6,521,150 B1 | * | 2/2003 | Maeda et al. | 264/102 |
| 6,545,081 B1 | * | 4/2003 | Nishihata et al. | 524/495 |
| 6,573,210 B1 | * | 6/2003 | Claussen et al. | 501/127 |

* cited by examiner

Primary Examiner—Brent A. Swarthout
(74) Attorney, Agent, or Firm—Antonelli, Terry, Stout & Kraus, LLP

(57) ABSTRACT

An electromagnetic wave absorber for use in the high frequency range above 1 Ghz and a composite member are characterized by the fact that magnetic metal grains are covered with ceramic above 20 volume %. Further, a method of manufacturing the electromagnetic absorber and the composite member is characterized by the fact that composite magnetic particles, in which a plurality of magnetic metal grains and ceramic are unified, are formed through a mechanical alloying method applied to a composite powder composed of magnetic metal powder and ceramic powder. The electromagnetic wave absorber can be used in a semiconductor device, an optical sending module, an optical receiving module, an optical sending and receiving module, an automatic tollgate in which erroneous operation due to electromagnetic wave disturbance is provided by use of the electromagnetic wave absorber.

10 Claims, 11 Drawing Sheets

50nm

ELECTROMAGNETIC WAVE ABSORBER, METHOD OF MANUFACTURING THE SAME AND APPLIANCE USING THE SAME

BACKGROUND OF THE INVENTION

The present invention relates to a novel electromagnetic wave absorber, a method of manufacturing the electromagnetic wave absorber, a composite member and an appliance of the electromagnetic wave absorber. More particularly, the invention relates to an electromagnetic wave absorber comprising composite magnetic particles composed of magnetic metal grains and ceramics, particularly, fine crystalline grains containing at least one kind of material selected from the group consisting of non-magnetic or soft magnetic metal oxides, carbides and nitrides. The invention also relates to a method of manufacturing the electromagnetic wave absorber, a composite member using the electromagnetic wave absorber, and a semiconductor device, a printed wire board, an optical sending and receiving module, an electronic toll collection system and an electronic device casing using the magnetic metal particles.

In accordance with the present invention, an optical sending module, an optical receiving module or an optical sending and receiving module integrating the optical sending module and the optical receiving module for use in a high speed communication network using optical fibers can be obtained, and the modules can be made small in size, light in weight, high in processing speed and high in sensitivity by suppressing noises emitted to the outside and noise interference inside the module.

In recent years, there have been significant advances in high speed processing in electronic equipment, and the operating frequency of an IC, such as an LSI or a microprocessor, has rapidly increased, with the result that undesirable noises are likely to be emitted.

Further, in the field of communication, the GHz band electromagnetic waves are proposed for use in the next generation of multimedia mobile communication (2 GHz) and in wireless LANs (2 to 30 GHz). In the field of the Intelligent Transport System (ITS), the Electronic Toll Collection System (ETC) uses 5.8 GHz electromagnetic waves, and the Advanced Cruise-assist Highway System (AHS) uses 76 GHz electromagnetic waves. It is expected that the range of use of high frequency electromagnetic waves will rapidly expand even further in the future.

As the frequency of electromagnetic waves is increased, an electromagnetic wave is apt to be emitted as a noise. Thus, in recent electronic equipment, due to a decrease in the noise margin due to a reduction in the electric power consumed by the equipment and by a decrease in the immunity (noise resistance) due to replacement of digital circuits to analogue circuits and the tendency of small-sizing and high-mounting density, the noise environment inside the equipment has been deteriorated, thereby to cause a problem of erroneous operation of the equipment due to electromagnetic interference (hereinafter, referred to as EMI).

Therefore, measures have been taken to reduce the EMI inside the electronic equipment by placing an electromagnetic wave absorber in the electronic equipment. As an electromagnetic wave absorber for the GHz band, a sheet composed of an electrically insulating organic material, such as rubber, a resin or the like, and a magnetic lossy material, such as a soft magnetic metal oxide, a soft magnetic metallic material or the like, is mainly used.

However, the electric resistivity is around 500 to 1000 $\mu\Omega\cdot$, which is not so high. Therefore, a decrease of the magnetic permeability due to eddy currents in the GHz region is inevitable. Further, in regard to the complex specific dielectric constant, since the imaginary part is large compared to the real part, because the electric resistivity is not sufficiently high, it is difficult to adjust the impedance matching.

In general, characteristics required for the electromagnetic wave absorber for electronic information-and-communication equipment are ① a large reflection attenuation coefficient (small reflection coefficient), ② a wide band capable of absorbing electromagnetic waves, and ③ a small thickness. However, no electromagnetic wave absorber capable of satisfying all of these characteristics has been developed as yet.

In order to attain the above item ①, it is necessary that the amount of electromagnetic waves reflected on the surface of the absorber is small. In order to do so, it is necessary to make the value $\sqrt{(\mu_r/\in_r)}$ of the characteristic impedance of the substance close to the value $\sqrt{(\mu_0/\in_0)}$ of the characteristic impedance of the free space. Therein, $\mu_r$ is a complex specific magnetic permeability $\mu_r(\mu_r'+j\mu_r'')$, $\in_r$ is a complex specific dielectric constant $\in_r(\in_r'+j\in_r'')$, and $\mu_0$ and $\in_0$ are the magnetic permeability and the dielectric constant of the free space, respectively. In order to attain the above item ②, it is necessary that the values $\mu_r'$ and $\mu_r''$ are gradually monotonously decreased with respect to frequency, while the relationship between the values $\mu_r'$ and $\mu_r''$ is being kept nearly constant. In order to attain the above item ③, it is necessary that the amount of attenuation of electromagnetic waves inside the substance is made large. In order to do so, it is necessary that the real part of the propagation constant $(\gamma=2\pi f(\mu_r, \in_r)^{0.5})$ of the substance is large, that is, the values of the complex specific magnetic permeability and the complex specific dielectric constant at a desired frequency are made large. However, as the value of the complex specific magnetic permeability becomes large, it is difficult to adjust the impedance matching of the substance with the free space.

Since the soft magnetic metal oxide material of spinel crystal structure as a proven electromagnetic absorber has an electric resistivity extremely higher than that of the soft magnetic metallic material, the magnetic permeability rapidly decreases in the GHz band though the reflection by eddy current is small. Therefore, a considerably large thickness is required in order to well absorb the electromagnetic waves.

On the other hand, the soft magnetic metallic material offers the possibility of providing a thin electromagnetic wave absorber, because the specific magnetic permeability is very high. However, in the high frequency region, the specific magnetic permeability is substantially decreased and the imaginary part of the complex specific dielectric constant is substantially increased due to eddy current loss because the electric resistivity is low. Therefore, the reflection becomes large, and the soft magnetic metallic material does not work as an electromagnetic wave absorber.

In order to solve the problem described above, Japanese Patent Application Laid-Open No.9-181476 proposes to use an ultra-fine crystalline magnetic film of a hetero-granular structure in which ferromagnetic ultra-fine crystalline metallic phases are dispersed in a metal oxide phase as an electromagnetic wave absorber in a high frequency range. Such a magnetic film is characterized in that soft magnetism is provided by the ferromagnetic ultra-fine crystals and high electrical resistivity is provided by the metal oxide phase, and thereby the eddy-current loss is reduced and a high magnetic permeability in the high frequency range can be obtained.

The method of manufacturing the electromagnetic wave absorber is that the soft magnetic metal and oxygen, nitrogen, carbon are sputtered together with a metal oxide phase constitutive element having an affinity with the above elements at a time to form an amorphous film containing these elements on a substrate such as an organic film, and then the film is heat-treated to form a two-phase structure by producing the ferromagnetic ultra-fine crystals in the metal oxide phase. However, the electromagnetic wave absorber has problems in that the cost is high because a large film-forming apparatus is required, and the use of the electromagnetic wave absorber is limited because of the thin-film structure.

Japanese Patent Application Laid-Open No.7-212079 and Japanese Patent Application Laid-Open No.11-354973 disclose an electromagnetic wave interference suppresser or an electromagnetic wave absorber composed of oblate shaped soft magnetic metal particles and organic bond. The soft magnetic metal particles are formed in an oblate shape having a thickness thinner than the skin depth to suppress eddy current, and an improvement in the magnetic resonance frequency is achieved by the effect of shape magnetic anisotropy, and improvement of magnetic permeability is achieved by reducing of the demagnetization field caused by the shape. As the result, an excellent electromagnetic wave absorption ability is obtained in the range of several MHz to 1 GHz. However, it does not have a sufficient thickness and absorption ability as an electromagnetic wave absorber used inside of electronic equipment or used for a high frequency region.

Further, Japanese Patent Application Laid-Open No.9-111421 proposes a magnetic material for loading coils which obtains high electric resistivity in a high frequency region by heat-treating a high magnetic-permeability amorphous alloy at a temperature above the crystallization temperature in an atmosphere containing at least one kind of gas selected from the group consisting of oxygen gas, nitrogen gas and ammonia gas to form crystal grains made of a high magnetic permeability alloy and oxide or nitride around the crystal grains.

Furthermore, Japanese Patent Application Laid-Open No.11-16727 proposes a magnetic thin film for high frequency magnetic elements composed of iron having ferromagnetism and nickel ferrite having magnetism, and having a structure of dispersing a magnetic phase in a ferromagnetic phase or the ferromagnetic phase in the magnetic phase, or laminating the ferromagnetic phase and the magnetic phase in a multilayer arrangement. However, this publication does not propose to use the magnetic thin films as an electromagnetic wave absorber.

Further, Japanese Patent Application Laid-Open No.9-74298 proposes an electromagnetic wave shield material formed by mixing ceramic and magnetic grains in a ball mill using a silicon nitride ball, and then sintering the mixture. However, the publication does not propose any electromagnetic wave absorber.

Further, in regard to the optical sending and receiving module, a preventive measure of internal interference caused by sending and receiving noises between the optical sending part and the receiving part is disclosed in Japanese Patent Application Laid-Open No. 11-196055.

SUMMARY OF THE INVENTION

An object of the present invention is to provide a thin electromagnetic wave absorber which has excellent electromagnetic wave absorbing characteristics in the high frequency range and which can be manufactured with a smaller number of production processes, and to provide a method of manufacturing the electromagnetic wave absorber, a composite using the electromagnetic wave absorber, and an appliance using the electromagnetic wave absorber.

Another object of the present invention is to provide an optical sending module, an optical receiving module and an optical sending and receiving module which can be made small in size, light in weight, high in processing speed and high in sensitivity using an electromagnetic wave absorber which has good applicability, and has electromagnetic wave absorption characteristics which are not deteriorated even at a transmission speed above 2.4 GHz.

An electromagnetic wave absorber in accordance with the present invention is characterized by the fact that it comprises composite magnetic particles preferably having a grain size smaller than 10 $\mu$m, particularly smaller than 5 $\mu$m, in which magnetic metal grains and ceramic are unified, preferably, magnetic metal grains and ceramic above 10%, preferably above 20%, in volume ratio are unified; and by the fact that it comprises composite magnetic particles in which a plurality of fine magnetic metal grains and ceramic are unified by enclosing the plurality of fine magnetic metal grains with a ceramic; and by the fact that it comprises composite magnetic particles in which a plurality of magnetic metal grains and ceramic are unified by embedding ceramics, preferably having a bar-shape, into magnetic metal grains.

That is, an electromagnetic wave absorber in accordance with the present invention is characterized by the fact that it comprises composite magnetic particles in which a large number of fine magnetic metal grains, preferably smaller than 0.1 $\mu$m, particularly smaller than 50 nm, and ceramic above 10 volume %, preferably 20 to 70 volume %, are unified. Particularly, the magnetic metal and the ceramic are formed in alternatively laminated layers in each grain, and the magnetic metal is provided in the form of complicated shaped particles, and the size of most of the particles is smaller than 100 nm, and the particles are enclosed with a ceramic. The complicated shaped particle is formed by gathering fine particles having a particle size smaller than 20 nm. Most of the ceramic is formed in a shape surrounding the magnetic particles, and a small amount of the ceramic is formed as bar-shaped grains.

It is preferable that the magnetic metal is at least one kind of metal or alloy selected from the group consisting of iron, cobalt and nickel, and the ceramic is at least one kind of ceramic selected from the group consisting of an oxide, nitride and carbide of iron, cobalt, nickel, titanium, barium, manganese, zinc, magnesium, aluminum, silicon, and copper; or that the ceramic particles are bonded onto the surface of the composite magnetic particles to unify the ceramic particles and the composite magnetic particles; or that most of the ceramic particles exist inside the crystalline grain and the grain boundary of the magnetic metal grains. It is preferable that the magnetic metal is a soft magnetic metal.

Further, the composite magnetic particles in accordance with the present invention are composite magnetic particles in which a magnetic metal particle and a ceramic are unified by embedding and mixing finely in nm-order the grains of a ceramic, such as metal oxide, inside a magnetic metal particle of soft magnetic ultra fine crystals. The high magnetic permeability obtained by finely crystallizing the soft magnetic metal and the high electric resistivity obtained by dispersing the ultra-fine ceramic grains are attained at the same time. Therefore, a high magnetic permeability can be maintained and better absorbing characteristics are also maintained even in the high frequency region.

Further, since the composite magnetic particle is formed by alternatively laminating a soft magnetic metal phase and a metal oxide phase, the width of the soft magnetic metal phase extends below the skin depth, and, accordingly, there is an effect equivalent to dispersing soft magnetic metal powder having a thickness below the skin depth. Therefore, the eddy currents can be reduced, and electromagnetic waves can be efficiently taken in. Further, by changing the mixing ratio and the combination of the metal oxide phase and the ferromagnetic ultra-fine crystalline metallic phase, the parameters relating to the characteristic of electromagnetic wave absorption of complex specific magnetic permeability and the complex specific dielectric constant can be comparatively freely controlled, and, therefore, a better characteristic of electromagnetic absorption can be obtained in a target frequency band.

In regard to the mixing ratio of the added ceramic particles, when the volumetric mixing ratio of ceramics is below 20 volumetric % to that of the soft magnetic metal particles, the electric resistivity is not improved sufficiently. Further, when the volumetric mixing ratio of non-magnetic ceramics is above 80 volumetric %, the magnetic permeability of the composite magnetic particles is decreased in an excessively low level to deteriorate the characteristic of electromagnetic wave absorption. From these facts, it is preferable that the volumetric mixing ratio of ceramics is 30 to 60 volumetric %.

In accordance with the present invention, the magnetic metal powder and the ceramic powder are unified by mixing them with each other in an ultra-fine state through the mechanical alloying method. The method of manufacturing an electromagnetic wave absorber in accordance with the present invention is characterized by the fact that composite magnetic particles are formed, in which the magnetic metal grains and the ceramic, preferably, above 10% in volume ratio, are unified. Further, the method of manufacturing an electromagnetic wave absorber in accordance with the present invention constitutes what is called a mechanical alloying method in which a composite powder, composed of a magnetic metal powder and a ceramic powder, and metallic balls or ceramic balls are placed in a pot. The size of the ball is larger than the grain size of the metallic powder, and the amount of balls is larger than the amount of the composite powder, preferably, in a ratio of 50 to 100 balls to 1 of the composite powder in weight. The pot is then rotated at a high speed, preferably 1500 to 3000 rpm to mix and unify the magnetic metal powder and the ceramic powder in an ultra-fine state by adding strong energy to the powders. By this method, the composite magnetic particles are formed, in which the plurality of fine magnetic metal grains and the ceramic are unified.

That is, the method of manufacturing the electromagnetic absorber in accordance with the present invention is characterized by the fact that the composite magnetic particles, in which more than 10% of the ultra-fine magnetic metal grains and the ceramic particles are dispersed, are formed through method generally called an alloying method in which the composite powder composed of the magnetic metal powder and the ceramic powder is mixed and unified into an ultra-fine state. Since the composite magnetic particles have a high electric resistivity in the high frequency region due to the ultra-fine state, a high magnetic characteristic can be obtained. Therefore, high electromagnetic wave absorption characteristic can be obtained.

The electromagnetic wave absorber in accordance with the present invention is characterized by the fact that the composite magnetic particles described above, preferably, 20 to 70 weight % of the composite magnetic particles, are dispersed in a material having an electric resistivity higher than the electric resistivity of the composite magnetic particles, particularly, a resin, an insulation paint or a ceramic sintered material. Therein, the reason why the composite magnetic particles are dispersed in a material having an electric resistivity higher than that of the composite magnetic particles is that the electric resistivity of the composite magnetic particle itself is not small enough to satisfy the requirements of an electromagnetic wave absorber, and the freedom of designing the electromagnetic wave absorber is increased by changing the mixing ratio of the composite magnetic particles. It can be said from this viewpoint that the composite magnetic material is better in a particle form than in a thin film form.

From the above, the electromagnetic wave absorber in accordance with the present invention, which is composed of composite magnetic particles, can be widely used in various application. For example, noise radiating in a semiconductor element can be prevented by mixing the electromagnetic wave absorber in a sealing resin of a resin sealing type semiconductor package; or, electromagnetic waves generated in an electronic circuit board itself can be absorbed by mixing the electromagnetic wave absorber into an electronic circuit board made of resin or an electronic circuit board made of ceramic or a metal oxide; or, an internal interference can be prevented by applying the electromagnetic wave absorber together with an insulation paint onto an inner surface of an electronic casing made of a metal.

A composite member in accordance with the present invention is characterized by the fact that the composite member comprises composite magnetic particles having a grain size smaller than 10 μm in which the plurality of magnetic metal grains with ceramic above 20% in volume ratio are unified; or the composite magnetic particles in which the plurality of fine magnetic metal particles and the ceramic are unified by enclosing the plurality of fine magnetic metal grains with the ceramic; or it comprises composite magnetic particles in which the magnetic metal grains and the ceramic are unified by embedding bar-shaped ceramics into the magnetic metal grains.

A composite member in accordance with the present invention is characterized by the fact that the composite member comprises any one of or a combination of composite magnetic particles having a grain size smaller than 10 μm in which the magnetic metal grains and the ceramic, preferably above 10% in volume ratio, are unified; and composite magnetic particles in which the plurality of fine magnetic metal particles and the ceramic are unified by enclosing the plurality of fine magnetic metal grains with the ceramic; and composite magnetic particles in which the magnetic metal grains and the ceramic are unified by embedding ceramics into the magnetic metal grains. The composite member can be manufactured through a method similar to that described above.

The present invention relates to a composite member formed by compounding composite magnetic particles, in which magnetic metal grains and ceramics are unified, and a material having an electric resistivity higher than that of the composite magnetic particles.

Further, the present invention relates to a composite member formed by compounding composite magnetic particles, in which magnetic metal grains and ceramics are unified, and at least one kind of a resin having an electric resistivity higher than that of the composite magnetic particle, such as alumina and silica.

It is preferable that the ceramic is contained as 10 to 75 vol % in the composite magnetic particle and has a granular structure dispersed in the magnetic metal grains. Further, in accordance with the present invention, it is preferable that the composite magnetic particles are formed by unifying fine crystals of a magnetic metal having an average grain size below 50 nm, preferably, below 20 nm, and ceramics of above 10 volume %, preferably, 15 to 70 volume %, and that an average crystal grain size of the composite magnetic particle is smaller than 50 nm. Further, the materials of the magnetic metal grains and the ceramic are the same as described above.

The electromagnetic wave absorber is characterized by the fact that the surface of the composite magnetic particles is coated with a material having an electric resistivity higher than the electric resistivity of the composite magnetic particles; and that the composite magnetic particles have an aspect ratio larger than 2 and an oblate shape; and that the composite magnetic particles are uniformly dispersed in the material having a high electric resistivity; and that the oblate composite magnetic particles are oriented in one direction in the material having a high electric resistivity; and that the material having a high electric resistivity is a polymer material or a ceramic sintered material.

By forming the composite magnetic particle so as to have a structure such that the ceramic phase having a high electric resistivity encloses the ultra-fine magnetic metal crystals, as described above, the electric resistivity can be improved in the GHz region compared to the use of single phase metal particles, and, in addition, the complex specific magnetic permeability can be also improved.

Therein, when the crystal grain size of the magnetic metal composing the composite magnetic particles, the exchange interaction between metal crystals is weakened to deteriorate the soft magnetic characteristic. Therefore, the magnetic permeability is decreased, and the electric resistivity is increased.

As a result, the crystal grain size of the magnetic metal composing the composite magnetic particles in accordance with the present invention is preferably below 50 nm, particularly preferably below 20 nm.

Further, by controlling the volume ratio of the ceramics in the composite magnetic particles, the parameters relating to the electromagnetic wave absorption characteristic of the complex specific magnetic permeability and the complex specific dielectric constant can be controlled. Therefore, a good electromagnetic wave absorption characteristic in a target frequency band can be obtained. When the volumetric mixing ratio of ceramic to the magnetic metal is below 10 volume %, the complex specific magnetic permeability becomes high because the electric resistivity is not sufficiently increased, but the complex specific magnetic permeability is rapidly decreased in the GHz region because of eddy current loss. Further, the imaginary part of the complex specific dielectric constant becomes too large to obtain a sufficient electromagnetic wave absorption characteristic. Particularly in the case where the ceramic phase is non-magnetism, when the volumetric mixing ratio of the ceramic exceeds 70 volume %, the real parts of the complex specific magnetic permeability and the complex specific dielectric constant of the composite magnetic particle are decreased too low. Therefore, in order to obtain a sufficient electromagnetic wave absorption characteristic, the electromagnetic wave absorber needs to have a rather large thickness.

For the above reason, it is preferable that the volumetric mixing ratio of the ceramic is 15 to 70 volume % relative to the soft magnetic metal grains.

The electromagnetic wave absorber in accordance with the present invention is characterized by the fact that the composite magnetic particles of, preferably, 20 to 80 volume % are dispersed in a materal having an electric resistivity higher than the composite magnetic particles, particularly, a resin, an insulation paint or a ceramic sintered material.

In accordance with the present invention, by forming the composite magnetic particle so as to have a structure such that the ceramic phase having a high electric resistivity encloses the fine magnetic metal crystals, the electric resistivity can be improved in the GHz region compared to the commonly used single phase metal particle, and, in addition, the complex specific magnetic permeability can be also improved.

Further, by controlling the volume ratio of the ceramics in the composite magnetic particles, the parameters relating to the electromagnetic wave absorption characteristic of the complex specific magnetic permeability and the complex specific dielectric constant can be controlled. Therefore, a good electromagnetic wave absorption characteristic in a target frequency band can be obtained. When the volumetric mixing ratio of the ceramic phase to the magnetic metal phase is below 20 volume %, the electric resistivity is not sufficiently increased. Particularly, when the volumetric mixing ratio of the ceramic exceeds 70 volume %, the magnetic permeability of the composite magnetic particle is decreased too low. Therefore, the thickness of the electromagnetic wave absorber can not be made thinner. For the above reason, it is preferable that the volumetric mixing ratio of the ceramic is 20 to 70 volume % to the soft magnetic metal grains.

The reason why the composite magnetic particles are dispersed in the material having an electric resistivity higher than that of the composite magnetic particle is ① that the electric resistivity of the composite magnetic particle itself is not sufficiently high to perform as an electromagnetic wave absorber, and ② that the real part of the complex specific dielectric constant can be made large because a micro capacitor can be found using the composite magnetic particle in an electrode, and ③ that the frequency characteristics of the complex specific magnetic permeability and the complex specific dielectric constant can be controlled by controlling the particle shape and the dispersing form of the composite magnetic particles, and ④ that the frequency characteristics of the complex specific magnetic permeability and the complex specific dielectric constant can be controlled by controlling the volumetric mixing ratio of the composite magnetic particles relative to the insulation resin.

In accordance with the present invention, the three phase structure of the magnetic metal phase, the high electric resistivity ceramic phase and the insulation material which is formed by unifying the composite magnetic particles with the insulation material having an electric resistivity higher than that of the composite magnetic particle is preferable compared to the two layer structure such as the composite body of magnetic metal single phase particles and insulation resin or the composite body of magnetic metal single phase particles and ceramic.

Therein, in order to further improve the electromagnetic wave absorption characteristics, it is preferable that the composite magnetic particle is formed to have an oblate shape with an aspect ratio larger than 2 and a thickness less than the skin depth, and the oblate composite magnetic particles are orientated in the material having the high electric resistivity. That is, the electromagnetic wave absorption characteristics can be further improved and thinning of the electromagnetic wave absorber can be attained by suppressing of the rapid decrease in the complex specific magnetic permeability due to eddy currents, and by increasing of the magnetic permeability by decreasing the effect of a demagnetizing field due to the particle shape and increasing of the magnetic resonance frequency by the shape magnetic anisotropy, and by improving the real part of the complex specific dielectric constant by increasing the area of the capacitor electrodes.

The methods of unifying the fine crystal grains of the magnetic metal (hereinafter, referred to as magnetic metal grains) and the ceramic applicable to the present invention are as follows. That is, the mechanical alloying method; and a method in which an alloy powder, which is composed of a magnetic metal and an element having an affinity with oxygen, nitrogen and carbon higher than the magnetic metal and which has a high content of any one of these gas elements, is fabricated through the atomizing method, and then the soft magnetic metal phase and the ceramic phase are separately produced by performing heat treatment of the alloy powder; and a method in which an alloy powder, which is composed of a magnetic metal and an element having an affinity with oxygen, nitrogen and carbon higher than the magnetic metal and which has a high content of any one of these gas elements, is fabricated through the atomizing method, and then heat treatment of the alloy powder is performed in a gas atmosphere containing any one of oxygen, nitrogen and carbon; and a method in which the soft magnetic metal phase and the ceramic phase are separately produced; and a sol-gel method using metal alkoxide. The manufacturing method is not limited to the above-described methods, but a manufacturing method capable of finally obtaining the composite magnetic particles composed of the magnetic metal grain phase and the high electric resistivity ceramic phase may be used as well.

In order to increase the electric resistivity of the composite magnetic particle itself, it is possible that a high electric resistivity film, such as an oxide film or a nitride film, is formed on the surface of the composite magnetic particle at the same time the composite magnetic particles are produced.

Further, it is possible to coat the surface of the composite magnetic particle with a material having a higher electric resistivity through a mechanical unifying method, preferably through the mechano-fusion method using a kind of shearing type mill.

The composite magnetic particles are kneaded with an insulation polymer material of 30 to 80 volume %. Examples of the preferable insulation polymer materials are polyester group resins; polyvinyl chloride group resins; polyvinyl butylal resin; polyurethane resin; cellulose group resins; copolymer of these resins; epoxy resin; phenol resin; amide group resins; imide group resins; nylon; acrylic resin; synthetic rubber; and so on. Epoxy resin is preferable. When the volumetric filling ratio of the composite magnetic particles relative to the resin is above 50 vol %, the electric resistivity of the resin composite body is decreased due to contact between the composite magnetic particles themselves. Therefore, it is necessary to add, at a time, a coupling treatment agent of silane group, alkylate group or titanate group, or a magnesium phosphate-borate insulation treatment agent.

As described above, by coating the surfaces of the composite magnetic particles with high electric resistivity material using the surface oxidation method, the mechanical unifying method or the chemical surface treatment method solely or in combination, the real parts of the complex specific magnetic permeability and the complex specific dielectric constant can be improved and the electromagnetic wave absorptivity can be improved while keeping the electric resistivity at a constant value even if the mixing ratio of the composite magnetic particles relative to the resin is increased.

The following applications of the electromagnetic wave absorber of the present invention are given as an example.

(1) In a semiconductor integrated device of the resin seal type, the composite magnetic particles are mixed in the sealing resin to suppress radiant noises in a semiconductor element level.

(2) In a printed wiring board, the paint comprising the electromagnetic wave absorber of the present invention is directly applied or a film wherein the paint is formed in a sheet-shape is attached onto a part of or the whole of both of a surface having a wiring circuit formed thereon and a surface of the insulation board not having a wiring circuit so as to form an electromagnetic wave absorption layer. Thereby, the occurrence of noise, such as a cross-talk, due to electromagnetic waves generated from the printed wiring circuit board can be suppressed. Particularly, high density and high integration of a multi-layer wiring circuit board can be attained with high reliability. The multi-layer wiring circuit board is constructed such that a first-layer wiring layer is formed as at least one side main surface of the semiconductor board, an insulation film is formed on the surface of the first-layer wiring layer, a second-layer wiring layer electrically connected to the first-layer wiring layer through a via-hole is formed on the insulation film, and this process is repeated to form multi-layer wiring circuits.

(3) A cap made of the composite magnetic particles and the material having an electric resistivity higher than that of the composite magnetic particles is mounted on a printed wiring board so as to enclose a semiconductor element operating as a noise source. Thereby, the electromagnetic waves emitted from the semiconductor element can be efficiently absorbed and the electromagnetic wave internal interference can be suppressed.

The insulation paint containing the composite magnetic particles is applied onto the inner surface of a metal electronic equipment casing, or an electronic equipment casing formed of the composite magnetic particles and a resin is used. Thereby, the electromagnetic wave internal interference can be suppressed.

Further, the present invention is characterized by a semiconductor device in which a semiconductor element mounted on a printed wiring board is sealed with a resin containing an electromagnetic wave absorber, wherein the resin in the side of the element is covered with a resin free from the electromagnetic wave absorber. The present invention is also characterized by a printed wiring board comprising a wiring circuit on an insulation board, and the circuit is covered with an insulation layer, wherein layers comprising an electromagnetic wave absorber are formed on a surface of the insulation board opposite to the surface having the wiring circuit formed thereon and on the insulation layer.

Further, the semiconductor device of the present invention is constructed such that a semiconductor element mounted on a printed wiring board is covered with a metal cap of which an inner peripheral surface is formed of an electromagnetic wave absorber; or a semiconductor element mounted on a printed wiring board is covered with a cap having an electromagnetic wave absorber; or a printed wiring board and a semiconductor element mounted on the board are covered with a casing having an electromagnetic wave absorber. It is preferable that the material described above is used for the electromagnetic wave absorber used in each of the semiconductor devices of the present invention.

In accordance with the present invention, in an optical sending or receiving module comprising an electric-optical converter used for a high speed communication network, by covering an optical sending element or an optical receiving element and the related circuit with an electromagnetic wave absorber having composite magnetic particles and the ceramic, or with an electromagnetic wave absorber in which the composite magnetic particles and a material having an electric resistivity higher than that of the composite magnetic particle are unified, the electromagnetic wave emitted outside the module and the noise interference inside the module can be suppressed. The electromagnetic wave absorber used in accordance with the present invention is the same as described above.

According to the present invention, the electromagnetic wave absorber composed of the composite magnetic particles in which the magnetic metal and the non-magnetic or magnetic ceramics are unified in ultra-finely dispersed manner can obtain the remarkable effect of having an excellent electromagnetic wave absorption characteristic compared to the electromagnetic wave absorber made of the simply mixed powder.

Further, according to the present invention, the electromagnetic wave absorber is formed by unifying the composite magnetic particles, each of which is composed of fine crystal grains of the magnetic metal (the magnetic metal grains) and the ceramic phase, particularly, fine crystal grains including at least one kind of non-magnetic or magnetic oxide, carbide and nitride, and the material having an electric resistivity higher than that of the composite magnetic particles. The electromagnetic wave absorber has a good electromagnetic wave absorption characteristic in the high frequency region, particularly, in the GHz region, and can be formed as a thin electromagnetic wave absorber, and can efficiently suppress electromagnetic wave interference inside the electronic equipment.

DESCRIPTION OF THE PREFERRED EMBODIMENTS (Embodiment 1)

A mixed powder consisting of Fe powder of 50 vol % having grain size of 1 to 5 µm and $SiO_2$ powder of 50 vol % having an average grain size of 0.3 µm, and balls made of SUS410 (diameter: 9.5 mm) with a weight ratio of the powders to the balls=1 to 80 were put into a pot made of stainless steel, and the pot was filled with argon gas, and MA (mechanical alloying) treatment was performed thereon at a rotation speed of 200 rpm for 100 hours. The composite magnetic particles after the MA was of indefinite shape, having complicated shapes, and the average particle size was several tens $\mu$m.

Figure 1:
FIG. 1 is a microscopic photograph (TEM photograph) showing a cross section of Fe—$SiO_2$ magnetic composite grains in accordance with the present invention.

FIG. 1 is a photograph of the structure obtained from observation of the composite magnetic particle using a TEM. The crystal grain size of Fe of the black portion in the photograph is 10 nm, and the composite magnetic particle has a complicated shape, and Si oxide of the white portion is formed in a network-shape so as to enclose Fe grains having a grain size below 100 nm. The fine Fe grains having a grain size below 20 nm were independently formed, and the complicated shaped Fe grains having a grain size larger than the grain size of the fine grains were formed by gathering the fine grains. Further, the Si oxide was dispersed in the Fe crystal grain boundaries, and the Fe grains and the Si oxide were alternatively formed in an oblate shape. Further, the Si oxide was also formed in a bar-shape, and Si oxide grains having a diameter below 0.05 $\mu$m and a length of 0.2 to 0.5 $\mu$m were formed with a density of 10 to 20 in number per 1 $\mu$m square.

Further, after MA, annealing of the composite magnetic particles was performed in a vacuum (the degree of vacuum: above $10^{-6}$ Torr) at a temperature of 500° C. for 1 hour. After that, the composite magnetic particles of 50% in volume ratio to epoxy resin were kneaded with the epoxy resin and press-formed into a tablet shape, and then the tablets were cured by uniaxially pressing with 210 kgf at 180° C. After that, the cured tablets were finished in a toroidal shape of 7−0.05 mm outer diameter, 3.04+0.06 mm inner diameter, 2 mm and 4 mm thickness.

When a complex specific dielectric constant and a complex specific magnetic permeability of the sample were measured using a measurement system composed of a network analyzer (a product of HP: 8720C) and a coaxial waveguide, after calibrating so that the magnetic permeability and the dielectric constant of the free space might become 1, the sample was inserted into the coaxial waveguide to measure two parameters S11 and S21 using two ports, and then the complex specific dielectric constant and the complex specific magnetic permeability were calculated from the measured parameters.

Further, when a reflection characteristic was measured, after calibrating so that the reflection coefficient of the free space might become 0, the sample was inserted into the coaxial waveguide to measure a parameter S11, and then the reflection coefficient of the sample was calculated from the measured parameter. The range of measured frequency was 50 MHz to 20 GHz.

In order to investigate the effect of the composite magnetic particles in which the insulation metal oxide particles were dispersed in a soft magnetic metal particle, measurements of complex specific magnetic permeability, complex specific dielectric constant and frequency characteristics of reflection coefficient were performed using the Fe—50vol % SiO$_2$ manufactured through the method of the present invention and a sample which was manufactured by performing mechanical milling treatment of Fe powder and SiO$_2$ powder separately under the same condition as that of the MA treatment and then annealing the powders, and after that, simply mixing the two annealed powders using a V-mixer and then forming the composite structure with epoxy resin. The results of comparison are shown in FIG. 2 to FIG. 4.

Figure 2:
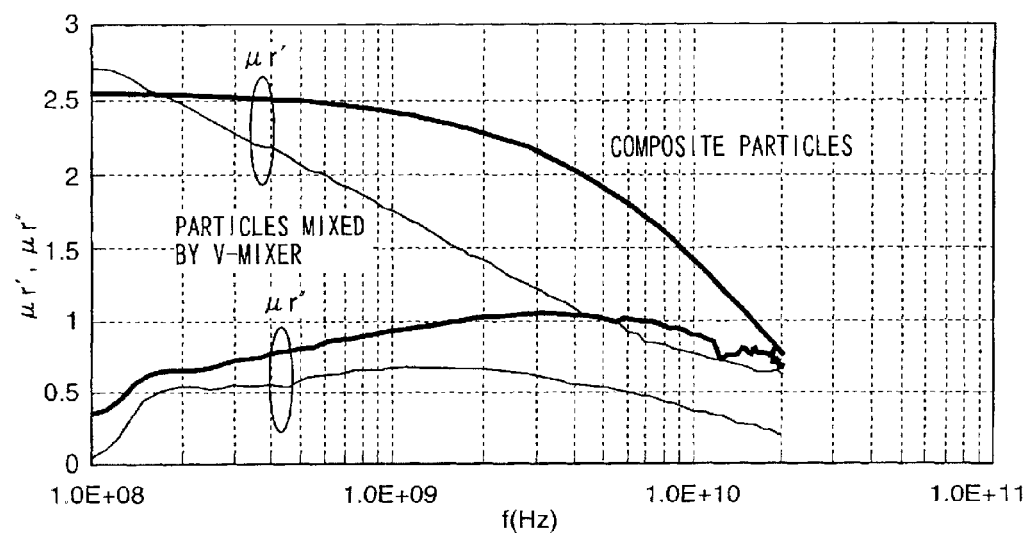
FIG. 2 is a graph showing a measured result of the frequency characteristics of the magnetic permeability of magnetic composite grains in accordance with the present invention and the magnetic permeability of a comparative mixed powder.

It can be understood from FIG. 2 that both the real part and the imaginary part of the complex specific magnetic permeability for the composite magnetic particle sample in the high frequency region are higher than those for the sample provided by simply mixing the Fe powder and the SiO$_2$ powder using the V-mixer.

Figure 3:
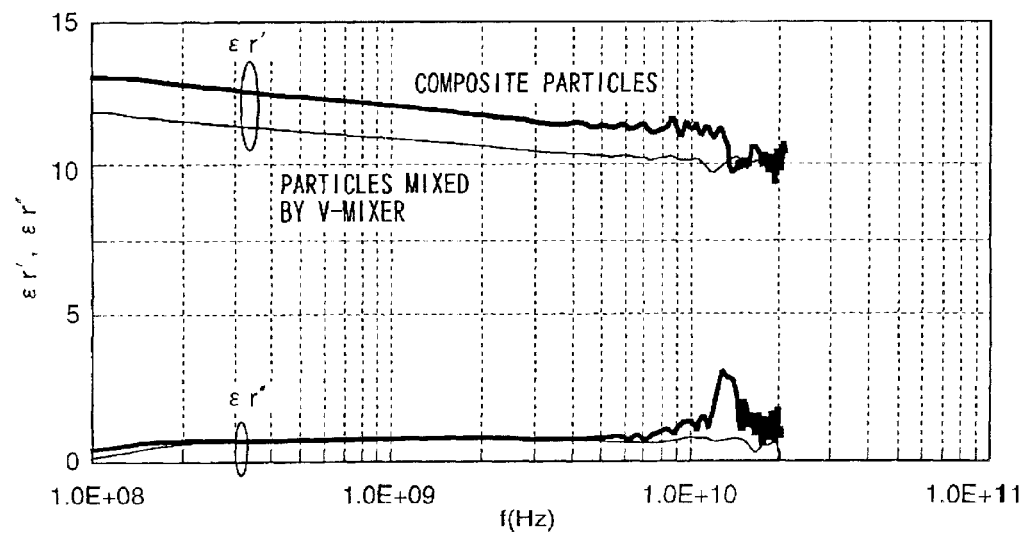
FIG. 3 is a graph showing a measured result of the frequency characteristics of the dielectric constant of the magnetic composite grains in accordance with the present invention and the dielectric constant of the comparative mixed powder.

It can be understood from FIG. 3 that both the real part and the imaginary part of the complex specific dielectric constant for the composite magnetic particle sample is slightly decreased due to the composite structure, and accordingly it is easy to adjust the impedance matching with the free space.

Figure 4:
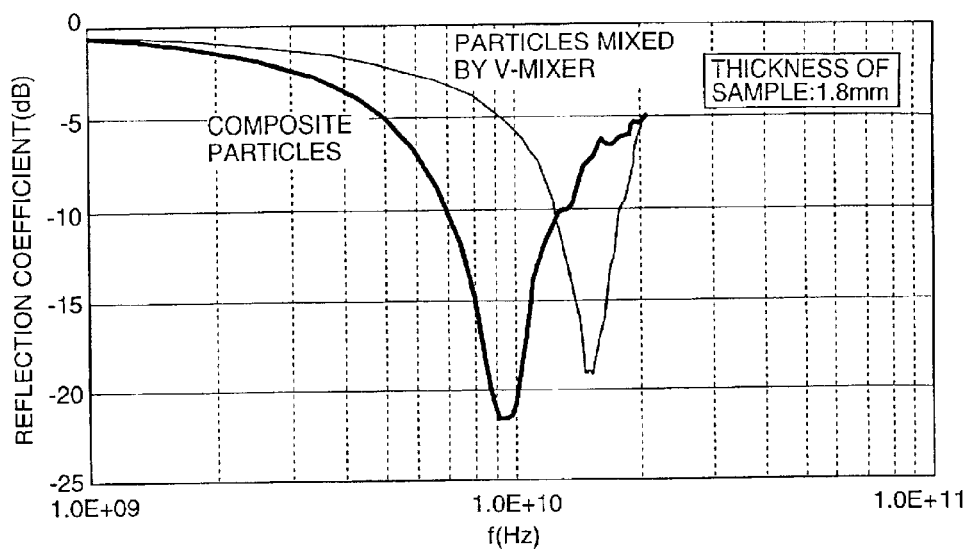
FIG. 4 is a graph showing a measured result of the frequency characteristics of reflectivity of the magnetic composite grains in accordance with the present invention and the reflectivity of the comparative mixed powder.

FIG. 4 shows the frequency characteristics of the reflection coefficients in a case of a sample thickness of 108 mm. The reflection coefficient for the composite magnetic particle sample is smaller, and the central frequency (a frequency where the reflection coefficient becomes minimum) for the composite magnetic particle sample exists in the lower frequency side. Further, the frequency band width satisfying the reflection coefficient below −10 dB is wider in the composite magnetic particle sample.

It can be understood from the above results that the electromagnetic absorption characteristic for the composite magnetic particle unified in the soft magnetic metal powder and the insulation metal oxide in the nano-meter scale is improved compared with that for the sample obtained by simply mixing the two kinds of powders.

(Embodiment 2)

A mixed powder consisting of Fe powder having a grain size of 1 to 5 $\mu$m and soft magnetic metal oxide powder of (Ni—Zn—Cu)Fe$_2$O$_4$ or (Mn—Zn)Fe$_2$O$_4$ (50:50 in volume ratio) having an average grain size of 0.7 $\mu$m, and balls made of SUS410 (diameter: 9.5 mm) with a weight ratio of the powders to the balls=1 to 80 were put into a pot made of stainless steel, and the pot was filled with argon gas, and MA (mechanical alloying) treatment was performed at a rotation speed of 200 rpm for 100 hours. The composite magnetic particles after the MA was of indefinite shape, and the average particle size was several tens $\mu$m. Further, the result of observing the composite magnetic particle using a TEM was similar to that of Embodiment 1. The crystal grain size of Fe was about 10 nm, and oxides including components of the soft magnetic metal oxide were finely dispersed in a network shape in the crystal grain boundary. Annealing of the composite magnetic particles was performed in a vacuum (the degree of vacuum: above $10^{-6}$ Torr) at temperature of 500° C. for 1 hour. The composite magnetic particle showed a structure similar to that of Embodiment 1.

In order to investigate the effect of the composite magnetic particles, measurements of various characteristics were performed using the composite magnetic particles according to the present invention and a sample which was manufactured by performing mechanical milling treatment of Fe powder and soft magnetic metal oxide powder separately under the same condition as that of the MA treatment and then annealing the powders, and after that, simply mixing the two annealed powders using a V-mixer and then forming the composite structure with epoxy resin. As results of comparison, an effect similar to that of Embodiment 1 was obtained.

(Embodiment 3)

A powder obtained by mixing Fe powder having a grain size of 1 to 5 $\mu$m and Si powder having an average grain size of 1.0 $\mu$m of 50:50 in volume ratio, and the same balls made of SUS410 as described above with a weight ratio of the powders to the balls=1 to 80 were put into a pot made of stainless steel together, and the pot was filled with oxygen gas (Ar:$O_2$=4:1), and mechanical alloying (MA) treatment was performed at a rotation speed of 200 rpm for 100 hours. The composite powder after the MA was of indefinite shape, and the average particle size was 5.0 μm. Further, as a result of observing the composite magnetic particle using a TEM, the crystal grain size of Fe was about 10 nm, and oxides including components of Si oxide were finely dispersed in a network shape in the crystal grain boundary. Further, as a result of an X-ray diffraction analysis, it was checked that there were Fe oxides ($Fe_2O_3$, $Fe_3O_4$). Similarly to the method described above, various kinds of characteristics of the composite magnetic particles mixed with epoxy resin were measured. As a result, a structure and characteristics similar to those of the composite magnetic particles manufactured through the method of Embodiment 1 were obtained.

(Embodiment 4)

The particle surfaces of the composite magnetic particles obtained from Embodiments 1 to 3 were coated with a non-magnetic or magnetic oxide having a high electric resistivity. The coating method used was a surface oxidation method or a mechanical composition method.

By setting the atmospheric condition at annealing in the manufacturing process of the composite magnetic particles to the atmosphere or an oxygen atmosphere as the surface oxidation method, it was checked from an X-ray diffraction analysis that oxides such as $Fe_3O_4$ were produced.

On the other hand, a mechano-fusion method using a kind of shearing type mill was employed as the mechanical composition method. In detail, the composite magnetic particles (average particle size: 10 μm) were used as the host particles, and $SiO_2$ (average particle size: 0.016 μm) or (Ni—Zn—Cu)$Fe_2O_4$ (average particle size: 0.5 μm) were used as the guest particles. The host particles and the guest particles were mixed in the volume ratio of 2:3, and then put into the mechano-fusion apparatus. The conditions of mechano-fusion were in a vacuum, rotating speed: 1000 rpm, and treatment time: 3 hours. As a result, it was checked from SEM observation that the surfaces of the composite magnetic particles were coated with relatively compact oxide film of about 1.0 μm thickness formed of the guest particles.

(Embodiment 5)

A mixed powder consisting of Fe powder of 70 vol % having grain size of 1 to 5 μm and $SiO_2$ powder of 30 vol% having an average grain size of 0.3 μm, and balls made of stainless steel were put into a pot made of stainless steel, and the pot was filled with argon gas, and mechanical alloying treatment was performed. The composite magnetic particles after the mechanical alloying was of indefinite shape, and the average particle size was several tens μm. After that, annealing of the composite magnetic particles was performed in a vacuum (the degree of vacuum: above $10^{-6}$ Torr) at a temperature of 500° C. for 1 hour.

The method of unifying the fine crystal grains of the magnetic metal (hereinafter, referred to as magnetic metal grains) and the ceramic grains is not limited to the mechanical alloying method described above. For example, the following methods are applicable. That is, a method in which an alloy powder, which is composed of a magnetic metal and an element having an affinity with oxygen, nitrogen and carbon higher than the magnetic metal and has a high content of any one of these gas elements, is fabricated through the atomizing method, and then the soft magnetic metal phase and the ceramic phase are separately produced by performing heat treatment of the alloy powder; and a method in which an alloy powder, which is composed of a magnetic metal and an element having an affinity with oxygen, nitrogen and carbon higher than the magnetic metal and has a high content of any one of these gas elements, is fabricated through the atomizing method, and then heat treatment of the alloy powder is performed in a gas atmosphere containing any one of oxygen, nitrogen and carbon; and a method in which the soft magnetic metal phase and the ceramic phase are separately produced; and a sol-gel method using metal alkoxide. The manufacturing method is not limited to the above-described methods, but a manufacturing method capable of finally obtaining the composite magnetic particles composed of the magnetic metal grain phase and the high electric resistivity ceramic phase may be used.

In order to increase the electric resistivity of the composite magnetic particle itself, it is possible that a high electric resistivity film, such as an oxide film or a nitride film, is formed on the surface of the composite magnetic particle at the same time producing the composite magnetic particles.

Further, it is possible to coat the surface of the composite magnetic particle with a material having a higher electric resistivity through a mechanical unifying method, preferably through the mechano-fusion method using a kind of shearing type mill. In detail, the composite magnetic particles (average particle size: 10 μm) were used as the host particles, and $SiO_2$ (average particle size: 0.016 μm) or (Ni—Zn—Cu)$Fe_2O_4$ (average particle size: 0.5 μm) were used as the guest particles. The host particles and the guest particles were mixed in the volume ratio of 2:3, and then put into the mechano-fusion apparatus (preferably in a vacuum, rotating speed: 1000 rpm, and treatment time: 3 hours). As a result, it was checked from SEM observation that the surfaces of the composite magnetic particles were coated with a relatively compact oxide film of about 1.0 μm thickness formed of the guest particles.

Figure 5:
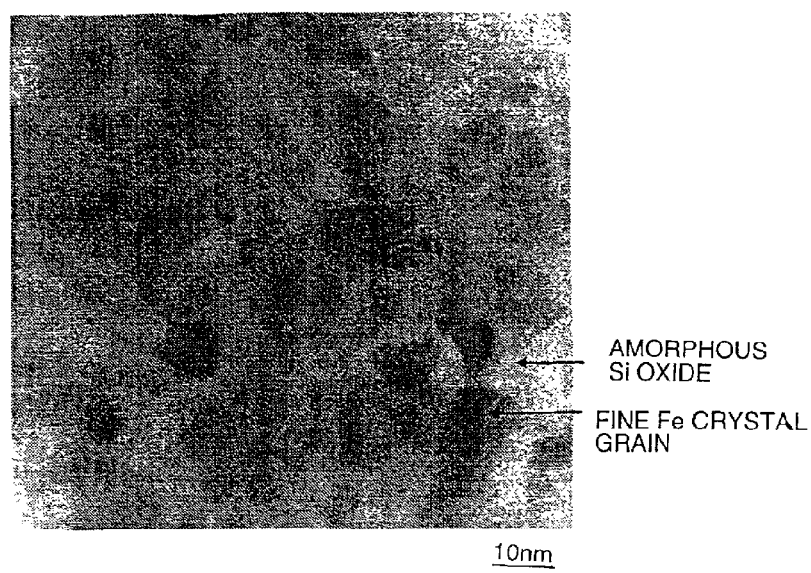
FIG. 5 is a photograph of an image produced by a high resolution transmission electron microscope showing a cross section of a composite magnetic particle in accordance with the present invention.

FIG. 5 is a TEM photograph of the composite magnetic particle annealed under a vacuum after the mechanical alloying treatment. The black portion in the photograph was fine crystal grains of Fe, and the crystal grain size was 10 to 20 nm. Amorphous Si oxide existed so as to enclose the fine crystal grains of Fe.

Then, after drying and crushing treatment, the composite magnetic particles were press-formed into a tablet shape under room temperature. Further, the tablets were cured by uniaxially pressing with 210 kgf at 180° C. Also, as other methods of manufacturing the resin composite body, there are the injection molding method, the transfer mold method and so on. When a sheet-shaped resin composite body is manufactured, the doctor blade method, the spin coat method, and the calendar roll method are applicable.

These resin composite bodies were finished in a toroidal shape of 7–0.05 mm outer diameter, 3.04+0.06 mm inner diameter, 0.5 to 2mm thickness by machining and grinding. Next, in regard to the characteristic evaluation method, when a complex specific dielectric constant and a complex specific magnetic permeability of the sample were measured using a measurement system composed of a network analyzer (a product of HP: 8720C) and a coaxial waveguide, after calibrating so that the magnetic permeability and the dielectric constant of the free space might become 1, the sample was inserted into the coaxial waveguide to measure two parameters S11 and S21 using two ports, and then the complex specific dielectric constant and the complex specific magnetic permeability were calculated using the Nicolson-Ross, Weir method from the measured parameters.

Further, when a reflection characteristic was measured, after calibrating so that the reflection coefficient of the free space might become 0, the sample was inserted into the coaxial waveguide to measure a parameter S11, and then the reflection coefficient of the sample was calculated from the measured parameter. The range of measured frequency was 0.1 to 18 GHz.

In order to compare the characteristics of the composite magnetic particles with those of single phase Fe particles, a sample was manufactured by separately performing mechanical milling treatment of Fe powder having a grain size of 1 to 5 $\mu$m and $SiO_2$ powder having an average grain size of 0.3 $\mu$m under the same condition as that of the mechanical alloying treatment, putting the Fe powder and the $SiO_2$ powder having a volume ratio of 70:30 together, and sufficiently mixing using a V-mixer, and then forming the mixed powder annealed in the same condition as described above into the composite structure with epoxy resin through the same method as described above. The complex specific magnetic permeability, the complex specific dielectric constant and the frequency characteristics of reflection coefficient of the sample were measured.

Figure 6:
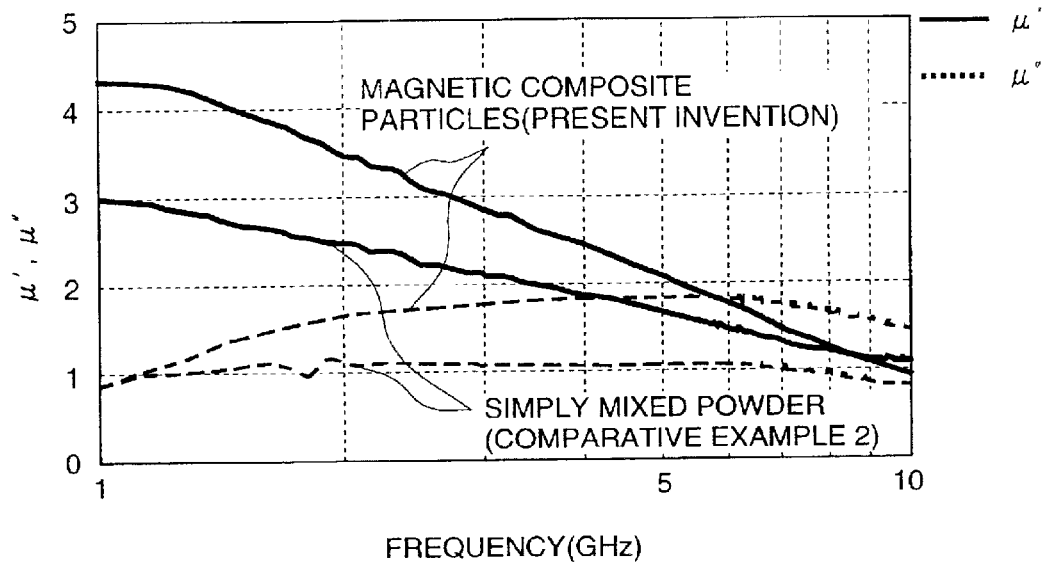
FIG. 6 is a graph showing the frequency characteristic of the complex specific magnetic permeability of a composite magnetic particle in which the magnetic metal phase and the ceramic phase are unified in nano-meter level.
Figure 7:
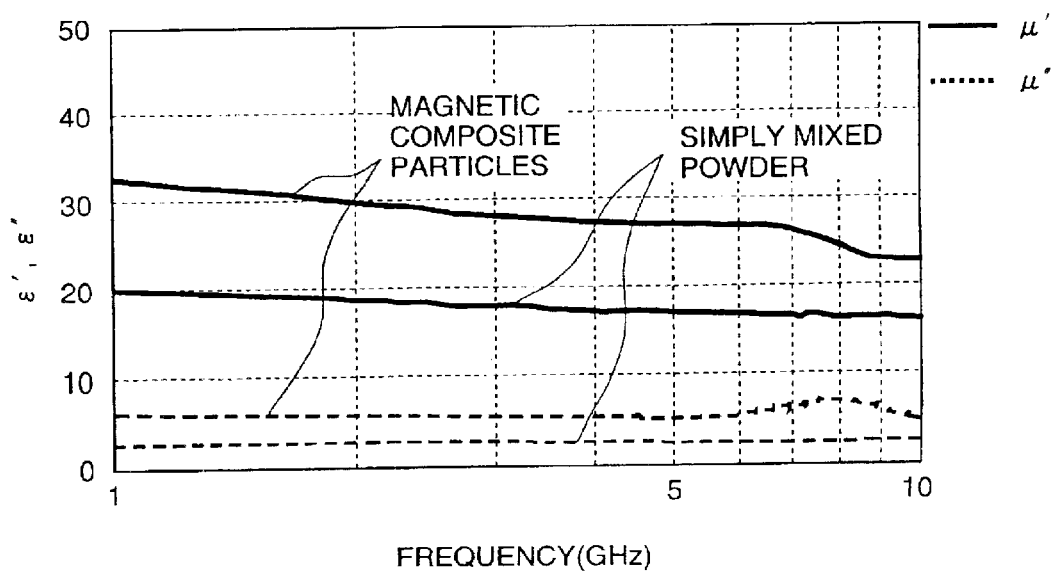
FIG. 7 is a graph showing the frequency characteristic of the complex specific dielectric constant of the composite magnetic particle in which the magnetic metal phase and the ceramic phase are unified in nano-meter level.
Figure 8:
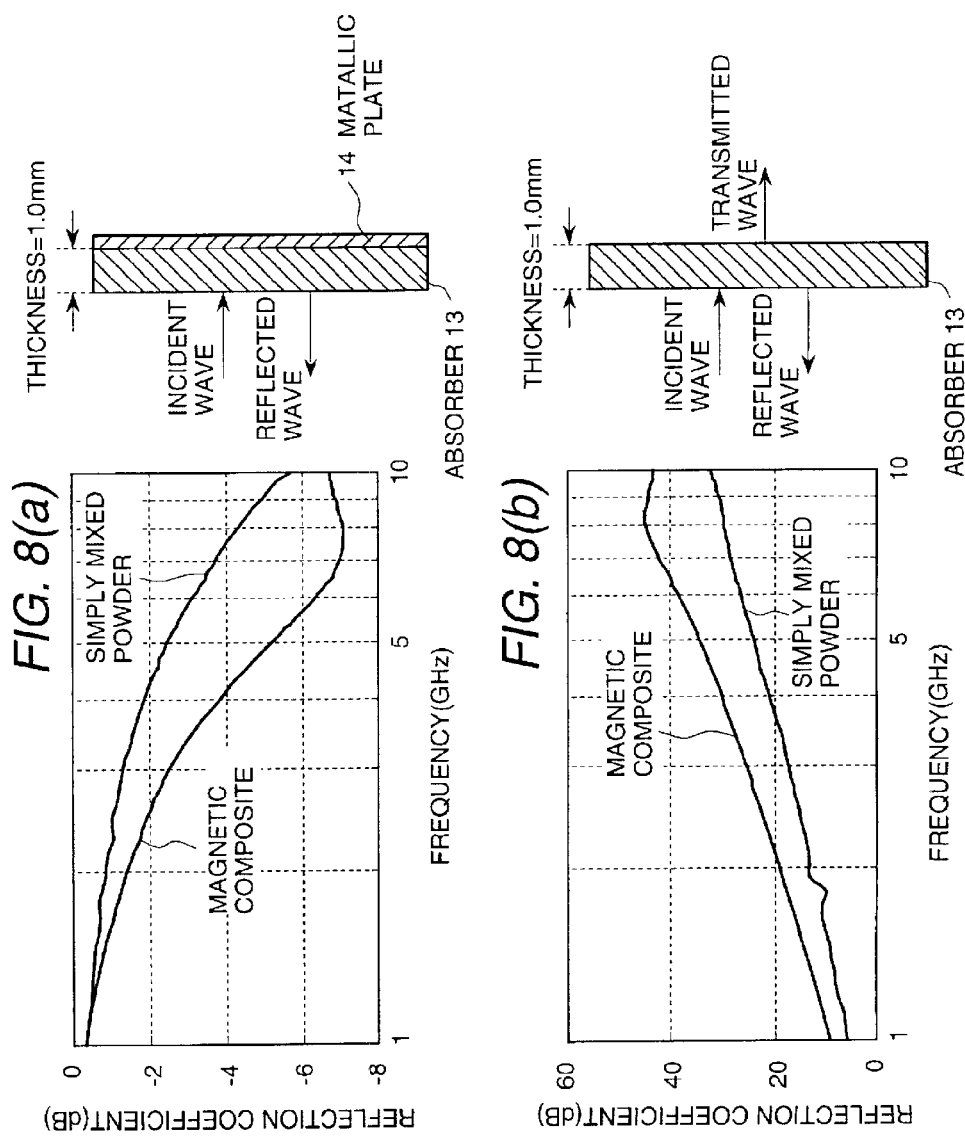
FIG. 8(a)(1) is a graph showing the frequency characteristic of the reflection coefficient of the composite magnetic particles in which the magnetic metal phase and the ceramic phase are unified in nano-meter level in an electromagnetic wave absorber having a metal plate on one side thereof, as shown in FIG. 8(a)(2).
FIG. 8(b)(1) is a graph showing the frequency characteristic of the reflection coefficient of the composite magnetic particles in which the magnetic phase and the ceramic phase are unified in nano-meter level in an electromagnetic wave absorber having no metal plate thereon, as shown in FIG. 8(b)(2).

FIG. 6 to FIG. 8 show comparison of the complex specific magnetic permeability, the complex specific dielectric constant and the frequency characteristics of reflection coefficient between the composite magnetic particles and the single phase Fe particles. It can be understood from FIG. 6 that both of the real part and the imaginary part of the complex specific magnetic permeability in the high frequency region for the composite magnetic particle sample are higher than those for the simple mixed powder of the Fe powder and the $SiO_2$ powder. It can be understood from FIG. 7 that the real part of the complex specific dielectric constant for the composite magnetic particles is larger than that of the simple mixed powder, and the imaginary part for the composite magnetic particles is also slightly increased. FIG. 8(a) shows the frequency characteristic of reflection coefficient in a case where there is a metal plate on the one side of the electromagnetic wave absorber, and it is seen that the reflection coefficient for the composite magnetic particle is smaller. FIG. 8(b) shows the measured results of an amount of electromagnetic wave absorption of the electromagnetic wave absorber itself, and it is seen that the amount of electromagnetic wave absorption for the composite magnetic particle is larger.

It can be understood from the above results that the electromagnetic absorption characteristic can be improved by unifying the soft magnetic metal grain phase and the high electric resistivity ceramic phase in the nano-meter scale.

(Embodiment 6)

In Embodiment 5, in cases where an alloy containing Ni, Co instead of Fe or containing at least one ferromagnetic metal among these metals, for example, parmalloy of Fe—Ni group, sendust of Fe—Al—Si group, Fe—Ni alloy group, Fe—Cr alloy group, Fe—Cr—Al alloy group were used, and in cases where alumina ($Al_2O_3$), Mn—Zn group ferrite, Ni—Zn group ferrite of spinel group as a magnetic oxide, in addition, plannar type hexagonal ferrite, magnetoplanbite type ferrite were used instead of $SiO_2$, the same effect could be obtained.

(Embodiment 7)

Figure 9:
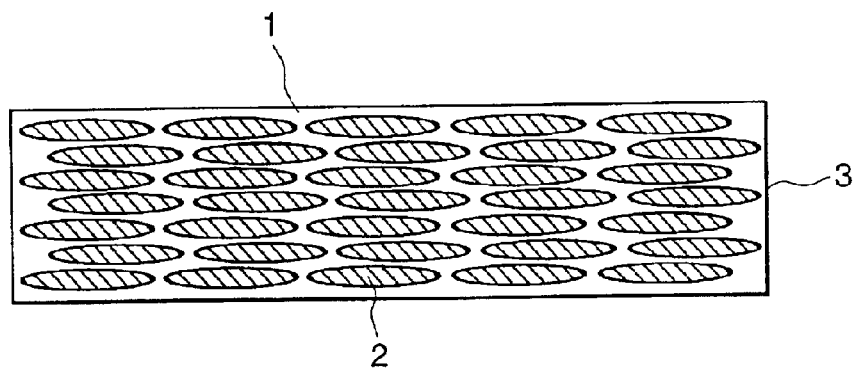
FIG. 9 is a cross-sectional view showing an electromagnetic wave absorber in which oblate composite magnetic particles are oriented in a resin.

In order to make the shape of the composite magnetic particles after mechanical alloying treatment in Embodiment 5 or 6 oblate, oblate composite magnetic particles having an aspect ratio above 2 were obtained by putting the composite magnetic particles into a crusher, such as a planetary ball mill (or an attriter), together with an organic solvent, such as ethanol, to perform wet treatment. After heat treatment, the oblate composite magnetic particles were mixed with a liquid resin to produce a paste state, then formed in a sheet-shape through the doctor-blade method in which shear force is applied to the composite magnetic particles, and then press-formed using a hot press. As the result of observing a cross section of the sheet using a SEM, the oblate composite magnetic particles were orientated, as shown in FIG. 9.

A composite compound of the oblate composite magnetic particles and a resin was manufactured in advance, and then injected to a metal mold using an injection molding machine. As a result of observing a cross section of the molded piece using a SEM, the oblate composite magnetic particles were highly orientated, as shown in FIG. 9. In the case where the oblate composite magnetic particles are highly oriented in the resin, it was observed that the real parts of the complex specific magnetic permeability and the complex specific dielectric constant were improved compared to those in Embodiments 5 and 6, and the electromagnetic wave absorptivity was largely improved.

(Embodiment 8)

Figure 10:
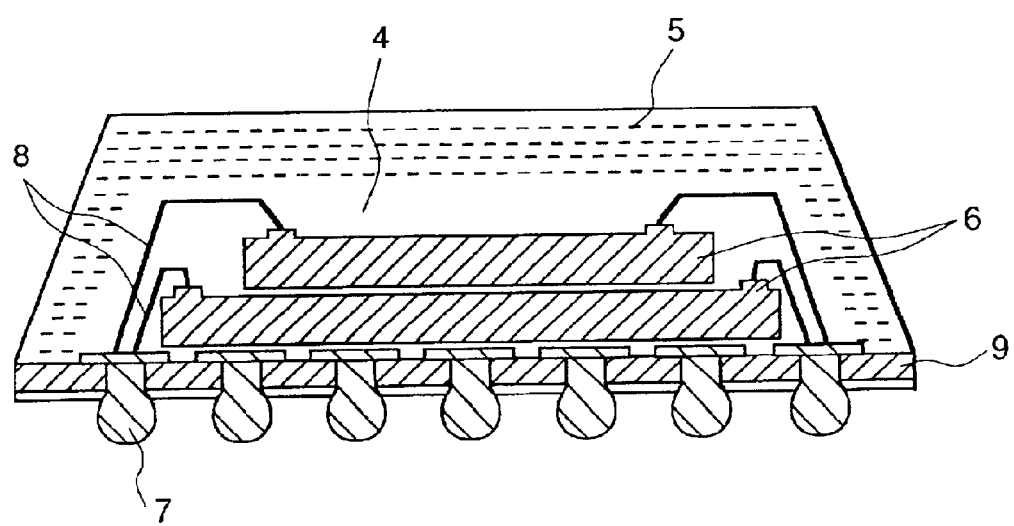
FIG. 10 is a cross-sectional view showing a semiconductor integrated element which is molded in a package with a sealing resin mixed with the composite magnetic particles.

FIG. 10 is a cross-sectional view showing a semiconductor integrated circuit device which is sealed with a sealing resin mixed with the composite magnetic particles described in Embodiments 1 to 7. As shown in FIG. 10, by molding packages with a sealing resin mixed with the composite magnetic particles in the manufacture of microprocessors or LSIs, electromagnetic waves generated from ICs and inner leads composing the semiconductor integrated circuit are absorbed to suppress the internal interference. By covering the semiconductor element side of the sealing resin mixed with the composite magnetic particles with a resin which is composite magnetic particle free, it is possible to prevent electric contact with the lead. Electric connection between the ICs and the externals is performed by solder balls 7 through the printed wiring board 9. The leads 8 are made of any one of Au, Cu or Al wire.

(Embodiment 9)

Figure 11:
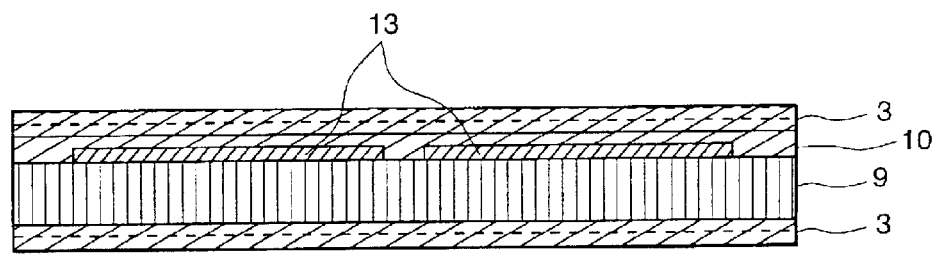
FIG. 11 is a cross-sectional view showing a printed wiring board having an electromagnetic wave absorption layer formed of the electromagnetic wave absorber in accordance with the present invention.

FIG. 11 is a cross-sectional view showing a printed wiring board having an electromagnetic wave absorption layer formed of the electromagnetic wave absorber described with reference to Embodiments 1 to 7. In a printed wiring board having a wiring circuit 13 in an insulation board 9, a paint comprising the electromagnetic wave absorber composed of the composite magnetic particles and a material having an electric resistivity higher than that of the composite magnetic particles is directly applied, or a film in which the paint is formed into a sheet-shape is attached onto a part or the whole of an insulation layer 10 on the surface of the insulation board 9 having a wiring circuit 13 formed thereon and the opposite surface of the insulation board 9 not having the wiring circuit to form an electromagnetic wave absorption layer. Thereby, occurrence of noises, such as by a cross-talk phenomenon, due to electromagnetic waves generated from the printed wiring circuit board. can be suppressed. Further, by arranging a conductive layer outside each of the electromagnetic wave absorption layers, the electromagnetic wave absorptivity can be improved, and the shielding effect on electromagnetic waves from the outside can be improved.

(Embodiment 10)

Figure 12A:
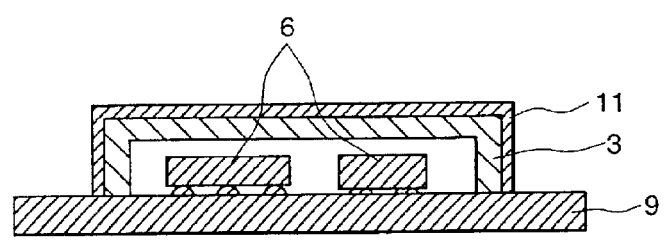
FIGS. 12(a) and 12(b) are cross-sectional views showing an electromagnetic wave absorption cap arranged on a printed wiring board so as to enclose a semiconductor element of a noise source.
Figure 12B:
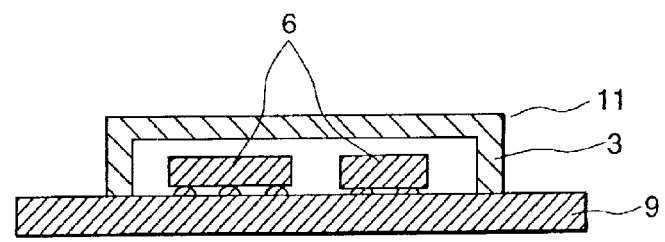

FIGS. 12(a) and 12(b) are cross-sectional views showing an electromagnetic wave absorption cap arranged on a printed wiring board so as to enclose a semiconductor element of a noise source. The electromagnetic wave absorption cap in accordance with the present invention is arranged on a printed wiring board so as to enclose semiconductor elements appearing as noise sources, such as a microprocessor, a system LSI etc. FIG. 12(a) shows a case where the electromagnetic wave absorption layer in accordance with the present invention is arranged on the inner surface of the metal cap, and electromagnetic waves from the outside can be shielded and electromagnetic waves emitted from the inside can be absorbed. FIG. 12(b) shows a case where a cap molded by injection molding of the electromagnetic wave absorber in accordance with the present invention is used. By mounting the cap, the electromagnetic waves emitted from the semiconductor element can be efficiently absorbed to suppress the internal interference.

(Embodiment 11)

Figure 13A:
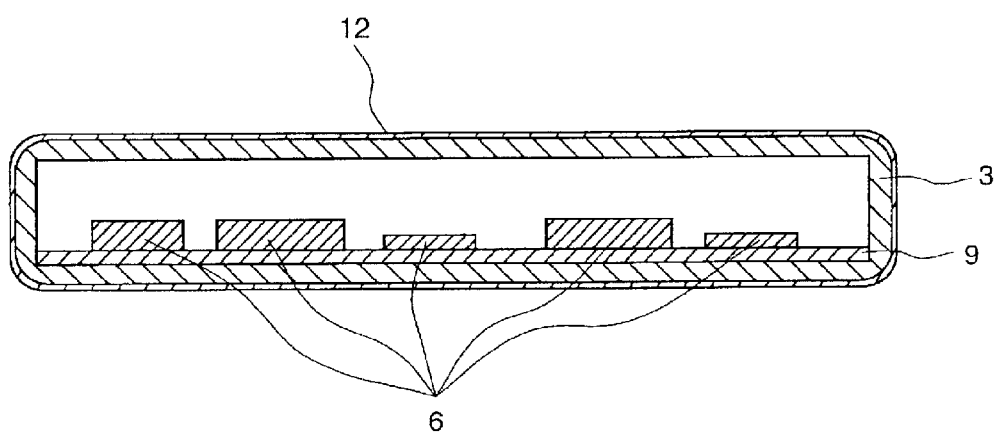
FIGS. 13(a) and 13(b) are cross-sectional views showing an electronic equipment casing formed of the electromagnetic wave absorber in accordance with the present invention.
Figure 13B:
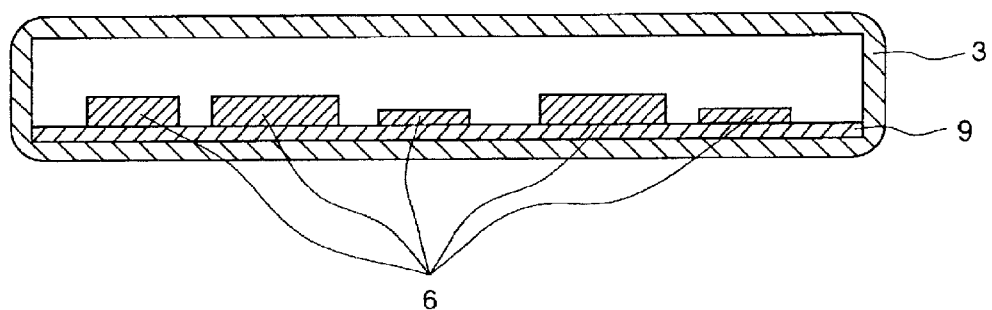

FIGS. 13(a) and 13(b) are cross-sectional views showing an electronic equipment casing formed of the electromagnetic wave absorber in accordance with the present invention. FIG. 13(a) shows a case where the electromagnetic wave absorption layer in accordance with the present invention is applied onto the inner surface of a metal casing for electronic equipment, or the electromagnetic wave absorption layer formed through injection molding is arranged on the inner surface. FIG. 13(b) shows a case where the electronic equipment casing is molded by injection molding of the electromagnetic wave absorber in accordance with the present invention. By adding the function of absorbing electromagnetic waves to the electronic equipment casing as described above, electromagnetic wave interference inside the electronic device can be suppressed.

(Embodiment 12)

Figure 14:
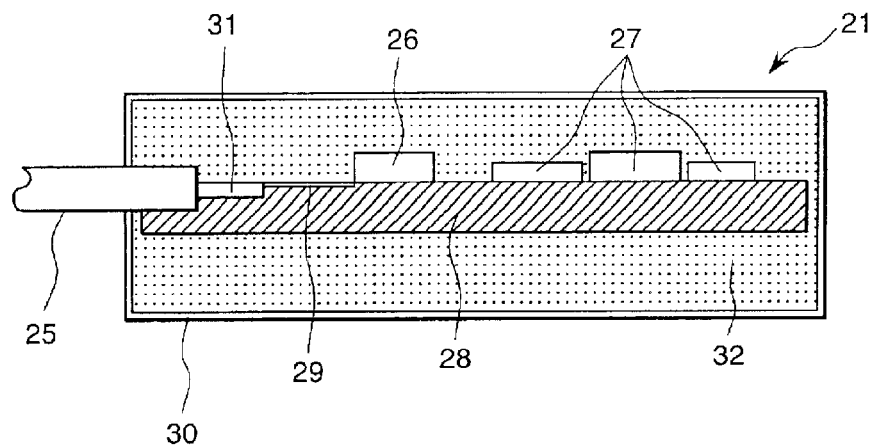
FIG. 14 is a cross-sectional view showing an optical sending module which is completely sealed with a resin mixture containing the composite magnetic particles, and in which the outside is further covered with a metal casing.

FIG. 14 is a view showing the construction of an optical sending module in accordance with the present invention. The optical sending module 21 comprises an optical fiber 25, an optical guide path 29, an LD 26, a sending circuit 27, a circuit board 28 etc. The sending circuit 27 is composed of an LD driver for driving the LD 26 of a laser diode, a laser output control part, a flip-flop circuit and so on. Actually, there are a lead frame, wiring and so on, but these elements are not shown in the figure. In the present embodiment, the optical sending module is perfectly sealed by putting it into a mold, by pouring the resin mixture containing the composite magnetic particles described Embodiments 1 to 7 into the mold, and by curing the resin mixture. Further, the outside of the molded optical sending module is covered with a metal casing 30. By doing so, the elements and the board can be protected from water and gas, and at the same time electromagnetic waves can be absorbed and shielded so as to suppress noise interference inside the sending module, and emission of electromagnetic waves outside the module can be completely prevented.

Figure 15:
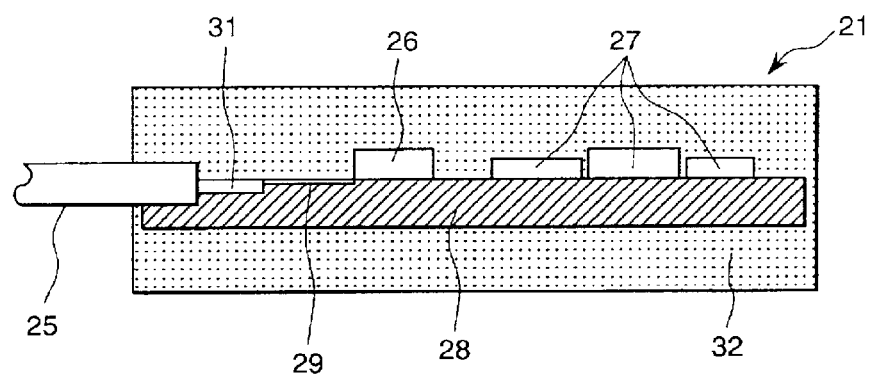
FIG. 15 is a cross-sectional view showing the optical sending module of which the metal casing is removed.

The metal casing 30 is not always necessary. Therefore, as shown in FIG. 15, the module may be only sealed with the resin mixture. This structure is inferior to the above case covered with the metal casing in absorption and shielding effects of electromagnetic waves, but has an advantage of low cost.

Further, short circuiting between the wires can be prevented by coating the surfaces of the composite magnetic particles with insulation. As a method of coating insulation, there are a method in which a film having an electric resistivity, such as an oxide film or a nitride film, is formed on the surface of the composite magnetic particle by heat treatment in an atmosphere; a chemical film forming method using a coupling treatment agent of silane group, alkylate group or titanate group, or a magnesium phosphate-borate insulation treatment agent; and a mechanical film forming method in which the surface of the composite magnetic particle is coated with a material having a higher electric resistivity through the mechano-fusion method using a kind of shearing type mill.

Figure 16:
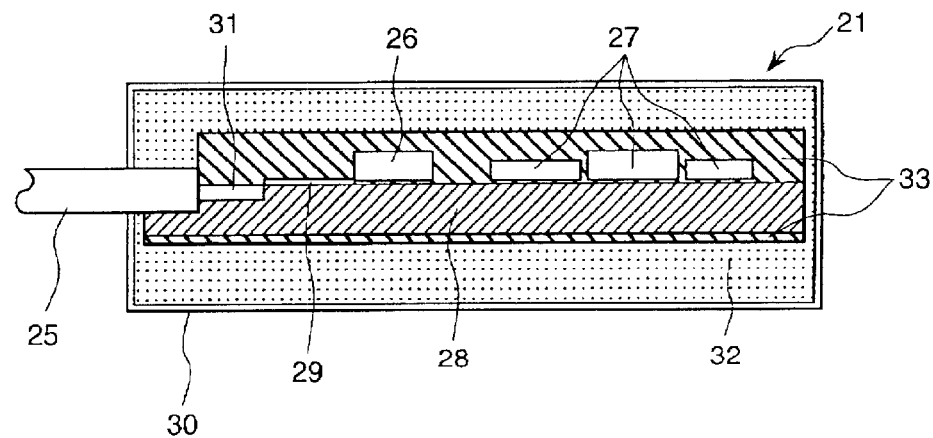
FIG. 16 is a cross-sectional view showing an optical sending module of two-layer structure in which only the wiring portion is sealed with an insulation resin not containing the composite magnetic particles, and the outside of the insulation resin is sealed with a resin mixture containing the composite magnetic particles.

Further, a more reliable method of preventing short circuiting between the wires is a two-layer structure in which only the wiring portions are sealed with an insulating resin not containing the composite magnetic particles, and then the resin mixture containing the composite magnetic particles is sealed thereon, as shown in FIG. 16.

The particle size of the composite magnetic particles is preferably below 40 $\mu$m when taking the fluidity of the resin mixture into consideration, though the size depends on the composition of the composite magnetic particle. The shape of the composite magnetic particles may be spherical or oblate. The filling amount of the composite magnetic particles relative to the resin is preferably below 60 vol % from the viewpoint of securing the fluidity of the resin mixture. The usable resins, in addition to epoxy group resin commonly used as sealing resin of electronic equipment, are polyester group resins; polyvinyl chloride group resins; polyvinyl butylal resin; polyurethane resin; cellulose group resins; copolymer of these resins; epoxy resin; phenol resin; amide group resins; imide group resins; nylon; acrylic resin; synthetic rubber; and so on.

Although the present embodiment has been described with reference to the LD 26 and the sending circuit 27, an optical receiving module may be similarly constructed by replacing these by a PD and receiving circuit.

(Embodiment 13)

Figure 17:
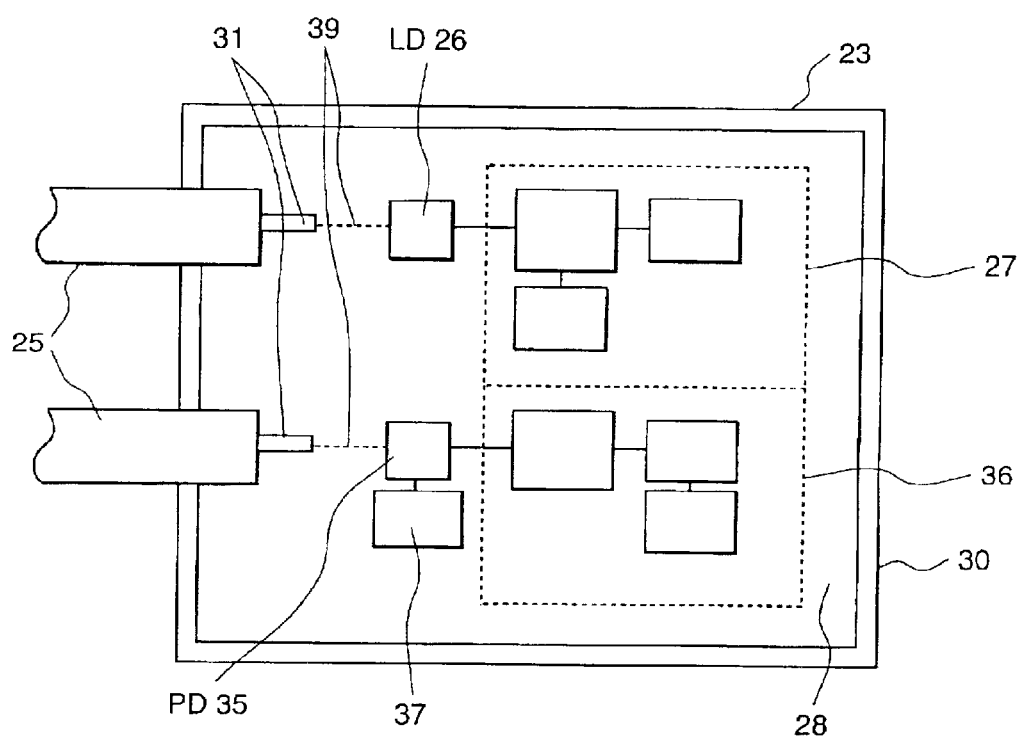
FIG. 17 is a schematic diagram showing a first form of an optical sending and receiving module.

FIG. 17 is a schematic diagram showing a first form of an optical sending and receiving module. The optical sending and receiving module 23 comprises the functions of both the optical sending module and the optical receiving module described above. The optical sending portion comprises an optical fiber 25, an optical guide path 29, an LD 26, a sending circuit 27, a circuit board 28 and so on. The sending circuit comprises an LD driver for driving a laser, a laser output control portion, a flip-flop circuit and so on. The optical receiving portion comprises an optical fiber 25, an optical guide path 29, a PD 35, a receiving circuit 36, a circuit board 28 and so on. The receiving circuit comprises a PRE IC having a pre-amplifying function, a CDR LSI composed of a clock extraction portion and an equivalent amplifier, an SAW of a narrow band filter, an APD bias control circuit and so on. Actually, there are a lead frame, wiring and so on, but these elements are not shown in the figure.

In the sending and receiving module integrating the sending module and the receiving module, the internal noise interference due to noise produced during sending and receiving between the optical sending portion and the optical receiving portion particularly becomes a problem, as described above.

In the present embodiment, the arrangement of the electromagnetic wave absorber can be constructed similarly to that of Embodiment 12, as shown in FIG. 14 to FIG. 16.

In a conventional optical sending and receiving module, noise interference is prevented by arranging a shield plate made of a metal between the sending portion and the receiving portion, or by enclosing each of the modules into a package made of a metal to form a separate sending module and a separate receiving module. However, such a module has problems in that the whole module becomes large in size and heavy in weight, and, in addition, the cost can not be lowered because of use of the high cost metal package. By employing the structure of the present invention, the noise interference inside the module can be prevented, and the module can be made small in size, light in weigh and low in cost.

Further, according to the present embodiment, it is possible to provide an optical sending module, an optical receiving module or an optical sending and receiving module having both an optical sending portion and an optical receiving portion, which are capable of being used in a high speed communication network, and which can suppress internal noise interference and noise emission to the outside, and can be made small in size, light in weight, high in processing speed and high in sensitivity.

(Embodiment 14)

Figure 18:
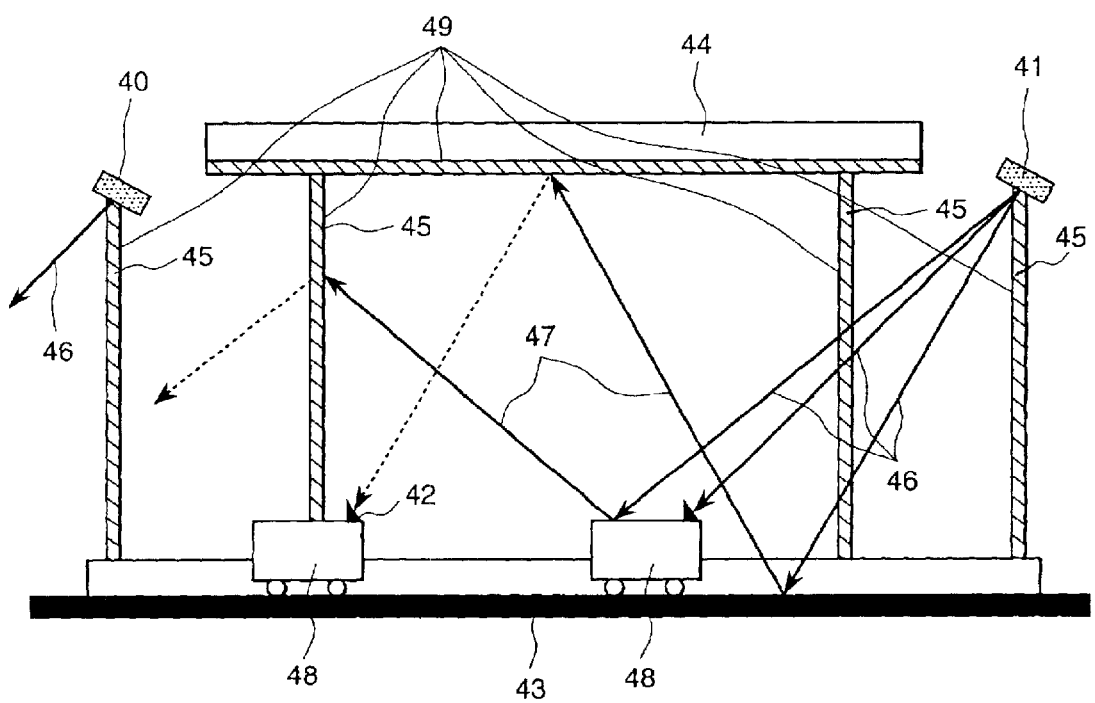
FIG. 18 is a schematic diagram showing the construction of a tollgate using an electronic toll collection system (ETC) in which the electromagnetic wave absorber in accordance with the present invention is arranged in the ceiling surface of the gate roof and columns.

FIG. 18 is a diagram showing the construction of a tollgate in which an electronic toll collection system (hereinafter, referred to as ETC) is employed. The ETC is capable of sending and receiving information between a road side communication unit and an in-car unit mounted on a vehicle passing through the tollgate.

As shown in FIG. 18, electromagnetic waves at a frequency of 5.8 GHz are used among an entrance portion antenna 40, an exit portion antenna 41 and the in-car unit 41 to exchange information necessary for paying and receiving a toll. The spread of the electromagnetic waves sent from the exit portion antenna 41 (direct wave 46) becomes wider due to an electromagnetic wave multi-reflection phenomenon with the road surface 43 and the ceiling 44 of the gate roof 43 or columns 45. Thereby, as shown in FIG. 18, it can be expected that an erroneous operation will be caused due to electromagnetic wave disturbance, such as a problem of interference by a vehicle in the adjacent lane and a problem of distinction between vehicles, such that the electromagnetic waves transmitted from the exit portion antenna 41 (direct wave 46) that are sent to the in-car unit of the vehicle A48 will, at the same time, produce a reflected wave 47 reflected by the roar surface 43 are sent to an in-car unit 42 of the following vehicle B48. Therefore, the above problem can be solved by arranging the electromagnetic wave absorbers containing the composite magnetic particles in the ceiling surface of the gate roof 44 and the columns to absorb the reflected wave.

A conventional electromagnetic wave absorber for ETC is of an integrated type, and the thickness is as thick as several tens cm. Therefore, it is difficult to attach it onto a portion having a complex shape. Accordingly, development of an electromagnetic wave absorber in the form of a paint or a soft and thin material is required. The electromagnetic wave absorber 49 is made of a resin mixture containing the composite magnetic particles and can be formed into a paint or a soft sheet depending on selection of the resin. Further, the composite magnetic particles are excellent particularly in the electromagnetic wave characteristics in the high frequency region above 5 GHz compared to the conventional soft magnetic metal particles. Therefore, these problems can be solved by the electromagnetic wave absorber in accordance with the present invention.

Figure 19:
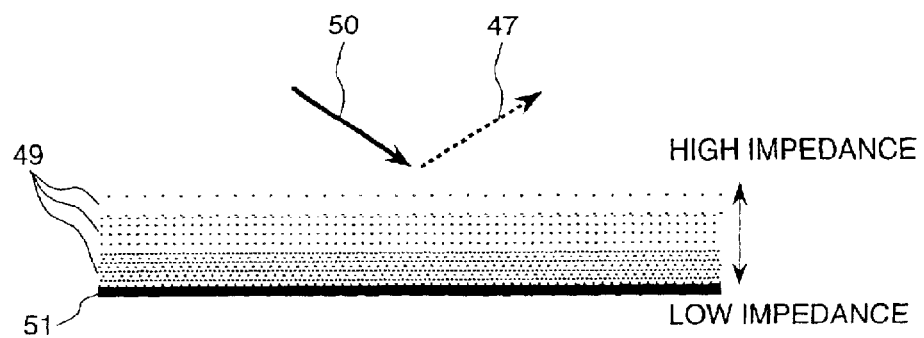
FIG. 19 is a diagram showing an electromagnetic wave absorber having a multi-layer structure in accordance with the present invention.

The electromagnetic wave absorber 49 using a resin mixture containing composite magnetic particles may be formed in a single layer structure. However, in order to improve the oblique incident characteristic, it is more effective if it is formed in a multi-layer structure in which the impedance of the electromagnetic wave absorber to the incident wave 50 is gradually decreased from the wave incident surface toward the side of the metal layer of a perfect reflector. In detail, the complex specific magnetic permeability and the complex specific dielectric constant are gradually decreased from the wave incident surface toward the side of the metal layer 51. In order to do so, the filling amount of the composite magnetic particles of the same composition to the resin is varied, or the composition of the composite magnetic particles in the resin is varied. Therein, the metal layer is not necessary when the attached surface is made of a metal. In FIG. 19, the electromagnetic wave absorber 49 is composed of three layers.

The particle size of the composite magnetic particle is preferably below 40 $\mu$m when taking the fluidity of the resin mixture into consideration, though the size depends on the composition of the composite magnetic particle. The shape of the composite magnetic particle may be spherical or oblate, but the invention is not particularly so limited. The filling amount of the composite magnetic particles relative to the resin for each layer is preferably 60 vol % at maximum from the viewpoint of securing the fluidity of the resin mixture. The usable resin may be any insulation polymer, and the resins described in Embodiment 12 are preferable.

What is claimed is:

1. An electromagnetic wave absorber comprising composite magnetic particles having a grain size smaller than 10 $\mu$m in which magnetic metal grains and ceramic are unified, wherein said composite magnetic particles are substantially oblate composite magnetic particles and are substantially oriented in one direction in said material having a high electric resistivity.

2. An electromagnetic wave absorber comprising composite magnetic particles in which a plurality of fine magnetic metal grains and ceramic are unified by enclosing said plurality of fine magnetic metal grains with said ceramic, wherein said composite magnetic particles are substantially oblate composite magnetic particles and are substantially oriented in one direction in said material having a high electric resistivity.

3. An electromagnetic wave absorber comprising composite magnetic particles in which magnetic metal grains and a plurality of ceramic grains are unified by embedding the ceramic grains into the magnetic metal grains, wherein said composite magnetic particles are substantially oblate composite magnetic particles and are substantially oriented in one direction in said material having a high electric resistivity.

4. An electromagnetic wave absorber formed by compounding together both composite magnetic particles, in which magnetic metal grains and ceramics are unified, and a material having an electric resistivity higher than an electric resistivity of the composite magnetic particles, wherein said composite magnetic particles are substantially oblate composite magnetic particles and are substantially oriented in one direction in said material having a high electric resistivity.

5. An electromagnetic wave absorber according to any one of claims 1 and 2 to 4, wherein said magnetic metal is at least one kind of metal or alloy selected from the group consisting of iron, cobalt and nickel, and said ceramic is at least one kind of ceramic selected from the group consisting of oxide, nitride and carbide of iron, aluminum, silicon, titanium, barium, manganese, zinc, magnesium, cobalt and nickel.

6. An electromagnetic wave absorber according to any one of claims 1 and 2 to 4, wherein a volume ratio of said ceramic to the composite magnetic particle is 10 to 75%, and said ceramic is embedded in said magnetic metal grains.

7. An electromagnetic wave absorber according to any one of claims 1 and 2 to 4, wherein an average crystal grain size of said composite magnetic particle is smaller than 50 nm.

8. An electromagnetic wave absorber according to any one of claims 1 and 2 to 4, wherein the surface of said composite magnetic particle is coated with a material having an electric resistivity higher than an electric resistivity of said composite magnetic particle.

9. An electromagnetic wave absorber according to any one of claims 1 and 2 to 4, wherein said composite magnetic particle has an aspect ratio larger than 2, and has an oblate shape.

10. An electromagnetic wave absorber according to any one of claims 1 and 2 to 4, wherein said composite magnetic particles are uniformly dispersed in said material having the high electric resistivity.

* * * * *